United States Patent [19]

Cantarella

[11] 4,417,339
[45] Nov. 22, 1983

[54] FAULT TOLERANT ERROR CORRECTION CIRCUIT

[75] Inventor: Robert G. Cantarella, Paoli, Pa.

[73] Assignee: Burroughs Corporation, Detroit, Mich.

[21] Appl. No.: 275,563

[22] Filed: Jun. 22, 1981

[51] Int. Cl.³ .............................................. G06F 11/10
[52] U.S. Cl. ...................................... 371/37; 371/49; 371/38
[58] Field of Search ...................... 371/37, 38, 30, 48, 371/49, 50, 57

[56] References Cited

U.S. PATENT DOCUMENTS

| | | | |
|---|---|---|---|
| 3,831,144 | 8/1974 | En | 371/50 |
| 3,983,536 | 9/1976 | Telfer | 371/37 |
| 4,005,405 | 1/1977 | West | 371/38 |
| 4,077,028 | 2/1978 | Lui et al. | 371/38 |
| 4,168,486 | 9/1979 | Legory | 371/50 |
| 4,175,692 | 11/1979 | Watanabe | 371/38 |
| 4,201,337 | 5/1980 | Lewis et al. | 371/37 |
| 4,291,407 | 9/1981 | Armstrong | 371/49 |
| 4,296,494 | 10/1981 | Ishikawa et al. | 371/38 |
| 4,334,309 | 6/1982 | Bannon et al. | 371/37 |
| 4,340,964 | 6/1982 | Sprick et al. | 371/38 |
| 4,345,328 | 8/1982 | White | 371/38 |
| 4,359,772 | 11/1982 | Patel | 371/38 |

Primary Examiner—Jerry Smith
Assistant Examiner—Gary V. Harkcom
Attorney, Agent, or Firm—Mark T. Starr; Edmund M. Chung; Kevin R. Peterson

[57] ABSTRACT

A fault tolerant error correction circuit utilizing any modified Hamming code is disclosed. In addition to correcting single bit errors and detecting double bit errors, the error correction circuit disclosed can tolerate the failure of any single parity check subcircuit without corrupting the information bits of a correct input data pattern. Improved reliability results because a using system will remain UP if there is a single bit error in the input data pattern or faults in a single parity check subcircuit, but not both. If both an error and a fault do occur, the error correction circuit will either report a double bit error or a correct output will be generated with no error indication.

28 Claims, 2 Drawing Figures

FAULT TOLERANT ERROR CORRECTION CIRCUIT

BACKGROUND OF THE INVENTION

The use of a single bit error correction, double bit error detection circuits based on modified Hamming codes is common in prior art fault tolerant memory and data transmission systems. In such prior art systems the correction circuit is part of the hard core of the system. Therefore, the correction circuit must be fault free.

It is the general object of the present invention to provide an improved error correction circuit which can correct single bit errors and detect double bit errors.

It is a further object of the present invention to provide an improved error correction circuit in which any single parity check subcircuit can fail without corrupting the information bits of a correct input data pattern.

It is an additional object of the present invention to provide an improved error correction circuit which will allow a using system to remain UP if there is a single bit error in the input data pattern or faults in a single parity check subcircuit.

It is still another object of the present invention to provide an improved error correction circuit which will respond to the occurrence of both a single bit error in the input data pattern and faults in a single parity check subcircuit by either reporting a double bit error or providing a correct output with no error indication.

These and other objects, features and advantages of the present invention will become more apparent from reading the Description of the Preferred Embodiment in conjunction with the drawings.

SUMMARY OF THE INVENTION

The present invention provides a fault tolerant error correction circuit which, in addition to correcting single bit errors and detecting double bit errors, can tolerate the failure of any single parity check subcircuit without corrupting the information bits of a correct input data pattern.

According to the invention, the error correction circuit receives an input data pattern including m information bits and k parity bits generated in accordance with a modified Hamming code. Each of the $k-1$ non-leading parity bits is exclusive ORed in one of $k-1$ parity check subcircuits with one of $k-1$ subsets of the m information bits, each of the $k-1$ subsets of information bits selected in accordance with the Hamming code being used. A syndrome bit is thus generated at the output of each of the $k-1$ parity check subcircuits.

The generated syndrome bits are decoded in accordance with the Hamming code to form an m element correction vector. Each element in the correction vector is exclusive ORed with a corresponding one of the m received information bits to form at the correction circuit's output a set of m output information bits.

The leading parity bit is exclusive ORed in an overall parity check subcircuit with the generated syndrome bits and a subset of the m received information bits, this subset of information bits also selected in accordance with the Hamming code being used. The overall parity check subcircuit generates at its output an indication of overall parity which is combined with the syndrome bits in a logical OR circuit to generate at the output of the OR circuit a first error status signal. The output of the OR circuit is combined with the inverted output of the overall parity check subcircuit in a logical AND circuit, the output of the AND circuit providing a second error status signal.

If neither error status signal is active, either no error was present in the input data pattern and no parity check subcircuit failed, or a parity bit was in error and the parity check subcircuit receiving that parity bit failed. In both cases the correct information bits are output.

If the first error status signal is active and the second error status signal is inactive, either the input data pattern was correct and a single parity check subcircuit failed, or a single information bit was in error and no parity check subcircuit failed, or a single parity bit was in error and no parity check subcircuit failed. In all three cases, correct information bits are output.

If both the first and second error status signals are active, either two bits in the input data pattern were in error, or an information bit was in error and a parity check subcircuit failed, or the leading parity bit was in error and a non-leading parity check subcircuit failed, or a non-leading parity bit was in error and a non-associated parity check subcircuit failed. In all four of these cases, the output information bits are not valid.

DESCRIPTION OF THE PREFERRED EMBODIMENT

Figure 1:
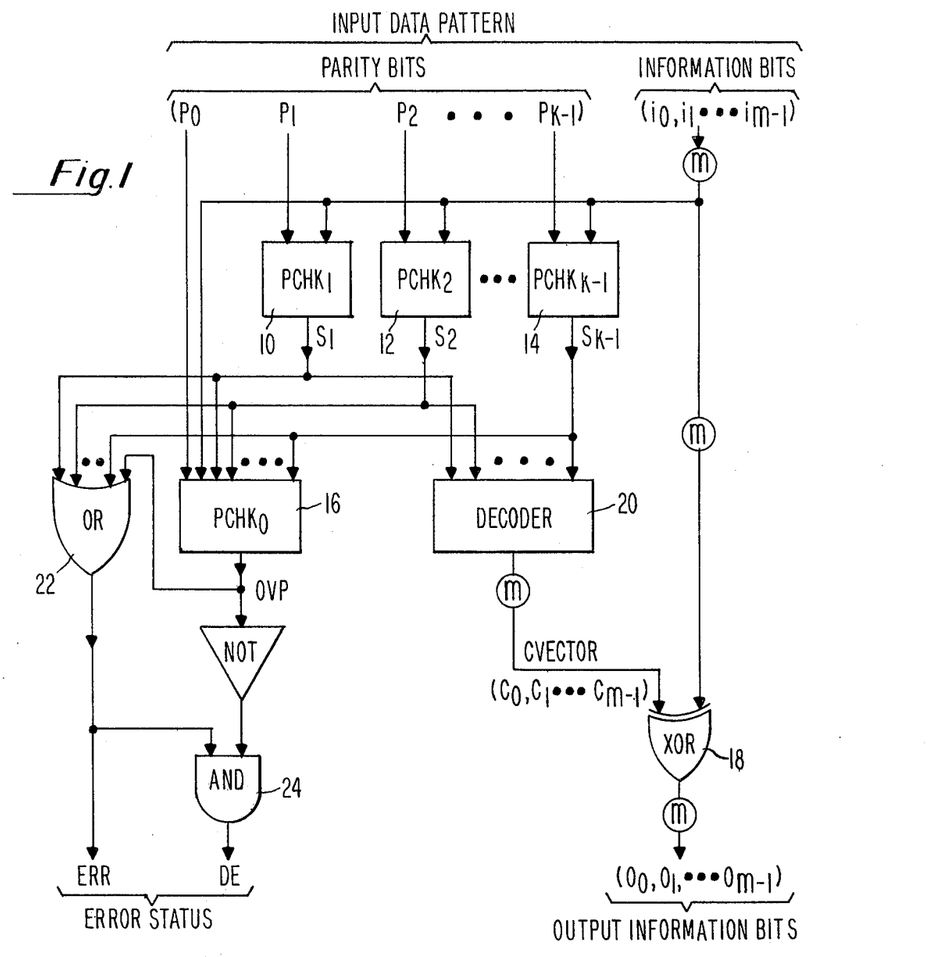
FIG. 1 is a block diagram illustrating the interconnection of the elements in the preferred embodiment of the present invention.

Referring now to the drawings, FIG. 1 is a block diagram of the fault tolerant error correction circuit of the present invention. The data pattern input to the error correction circuit has been encoded in a modified Hamming code and consists of m information bits $i_0, i_1, \ldots, i_{m-1}$ and k parity bits $p_0, p_1, \ldots, p_{k-1}$.

The design of Hamming codes is well known in the prior art. In a typical Hamming code, such as that specified in FIG. 2, every information bit is involved in the generation of a unique number of parity bits. Typically, the k parity bits are generated in accordance with the Hamming code being used and then stored in a storage location associated with the location where the m information bits are stored in their original form. When an access is made to the storage location containing the information bits, the associated k parity bits are also accessed. Thus, both the m information bits and associated k parity bits are read from storage and inputted to the error correction circuit of FIG. 1.

Since the error correction circuit will operate on inputs generated in accordance with any Hamming code, the description will consider the general case applicable to any Hamming code. However, in order to aid in a better understanding of the present invention, a specific example utilizing the modified Hamming code specified in FIG. 2 will also be presented.

As in prior art error correction circuits, the present invention has the capability to correct any single bit error in the input data pattern and provide corrected output information bits $o_0, o_1, \ldots, o_{m-1}$. Error status information is provided by the ERR (error) and DE (double error) lines. If there is no error, ERR and DE both equal zero and the output information bits $o_0, o_1,$ ..., $o_{m-1}$ are the same as the input information bits $i_0, i_1, \ldots, i_{m-1}$. If there is a one bit error in the input data pattern, ERR=1, DE=0, and the correct output information bits are generated. If there is a two bit error in the input data pattern, ERR=1, DE=1, and the output information bits are not valid.

As will be further explained in the discussion that follows, in addition to having all capabilities of prior art error correction circuits, the present invention provides correct output information bits if there is a correct input data pattern and a failure occurs in one of the parity check subcircuits. The present correction circuit accomplishes this by treating the parity check subcircuit failure as an input parity bit error and logging information indicating that an input parity bit is error. In such case, the output information bits will be correct. In contrast, if the same parity check subcircuit failure occurred in a prior art correction circuit, the prior art correction circuit could not recover and would provide incorrect output information bits.

If the error correction circuit of the present invention experiences a failure in a parity check subcircuit and an error in an input parity bit or input information bit, the circuit will indicate a double error. This occurs since by having a failure in a parity check subcircuit, the present invention looses its ability to correct errors; viz., it is no longer an error correction circuit. However, in such case the present correction circuit does not corrupt the output information bits as would some prior art correction circuits which experienced such a double failure.

The discussion will now consider the theory of operation of the present error correction circuit. As previously mentioned, a modified Hamming code is used to generate the parity bits which are stored in storage with the associated information bits. The non-leading parity bits $p_j$, where $1 \leq j \leq k-1$, are computed over unique subsets of the information bits in accordance with $$p_j = i_{j0} \oplus i_{j1} \oplus \ldots \oplus i_{jl_j}, \quad 1 \leq j \leq k-1 \quad (1)$$

Equation 1 is the generalized equation for producing the non-leading parity bits for any Hamming code. The unique subsets over which the non-leading parity bits are calculated have the property that each information bit occurs in a unique sequence of at least two parity bit equations. In equation 1, $p_j$ is the $j^{th}$ parity bit and $i_{j0}$ is the first information bit (as specified by the Hamming code being used) included in the calculation of $p_j$. The subscript $l_j$ is the limit for the particular $p_j$ and corresponds to the last information bit position included in the calculation of $p_j$. Thus $l$ depends on $j$. As an example, if the Hamming code used specified using the first, second, fourth, and fifth information bits to calculate $p_6$, then $$p_6 = i_{60} \oplus i_{61} \oplus i_{62} \oplus i_{63},$$

the last term $i_{6l_6}$ in equation 1 corresponding to the last information bit $i_{63}$ used in the calculation of $p_6$. Thus, in this case we would have $$p_6 = i_1 \oplus i_2 \oplus i_4 \oplus i_5$$

The leading parity bit $p_0$, which was stored with the non-leading parity bits and which is read from memory and inputted to the correction circuit is calculated in accordance with the general equation $$p_0 = p_1 \oplus p_2 \oplus \ldots \oplus p_{k-1} \oplus i_0 \oplus i_1 \oplus \ldots \oplus i_{m-1} \quad (2)$$

The leading parity bit $p_0$ which is dependent on the non-leading parity bits and, as will be seen from the discussion to follow, is used to detect double error conditions.

With the inputs to the present correction circuit thus defined, attention will be turned to the present correction circuit's operation. The present correction circuit contains $k-1$ parity check subcircuits $PCHK_1$, $PCHK_2, \ldots, PCHK_{k-1}$, three of which are identified in FIG. 1 as elements 10, 12 and 14, respectively. Each of the parity check subcircuits 10, 12 and 14 is used to compute and provide at their respective outputs syndrome bits $s_1$, $s_2$, and $s_{k-1}$. Although only three parity check subcircuits are shown in FIG. 1, those skilled in the art will realize that $k-1$ parity check subcircuits are included to produce $k-1$ syndrome bits.

Thus, each syndrome bit $s_j$ is calculated from the exclusive OR of the inputted parity bit $p_j$ and each member of the unique subset of information bits defined by the Hamming code for each respective parity bit $p_j$. The general equation for calculating the syndrome bits is $$s_j = p_j \oplus i_{j1} \oplus i_{j2} \oplus \ldots \oplus i_{jl_j} \quad (3)$$

The circuitry required to implement the logical function defined by equation 3 will be obvious to those skilled in the art.

The leading parity bit $p_0$ is checked by overall parity check subcircuit $PCHK_0$ 16 which computes the overall parity (OVP) as a function of $p_0$, the syndrome bits, and a subset of the information bits $i_{01}, i_{02}, \ldots i_{0l_0}$. The general equation for calculating OVP is $$OVP = p_0 \oplus s_1 \oplus s_2 \oplus \ldots \oplus s_{k-1} \oplus i_{01} \oplus i_{02} \oplus \ldots i_{0l_0} \quad (4)$$

In the prior art correction circuits, the overall parity OVP' is calculated by $$OVP' = p_0 \oplus p_1 \oplus p_2 \oplus \ldots \oplus p_{k-1} \oplus i_0 \oplus i_1 \oplus \ldots \oplus i_{m-1} \quad (4a)$$

In prior art correction circuits which use equation 4a to calculate OVP', if a parity check subcircuit fails, it appears to the correction circuit that a parity bit has failed. However, overall parity is not violated and a double bit error is reported.

In contrast with such prior art correction circuits, the overall parity of the presently disclosed correction circuit will be violated by a parity check subcircuit failure. This is accomplished by the present correction circuit's construction wherein when there is a parity check subcircuit failure, the correction circuit is fooled into thinking that there is a single bit error rather than a double error.

In the prior art (eg. 4a), the input parity bits are fed directly into the overall parity check subcircuit. In the present invention, we want to figure out which information bits must be fed into $PCHK_0$ circuit 16 to make it equivalent to equation 4a. Thus, we set equation 4 equal to equation 4a and solve for $i_{01} \oplus i_{02} \oplus \ldots \oplus i_{0l_0}$. Thus, $$p_0 \oplus s_1 \oplus s_2 \oplus \ldots \oplus s_{k-1} \oplus i_{01} \oplus i_{02} \oplus \ldots \oplus i_{0l_0} = \quad (5)$$
$$p_0 \oplus p_1 \oplus p_2 \oplus \ldots \oplus p_{k-1} \oplus i_0 \oplus i_1 \oplus \ldots \oplus i_{m-1}$$

By exclusive ORing both sides of equation 5 by $(p_0 \oplus s_1 \oplus s_2 \oplus \ldots \oplus s_{k-1})$, we have $$i_{0_1} \oplus i_{0_2} \oplus \ldots \oplus i_{0_{l_0}} = p_0 \oplus p_1 \oplus p_2 \oplus \ldots \oplus p_{k-1} \quad (6)$$
$$\oplus (i_0 \oplus i_1 \oplus \ldots \oplus i_{m-1})$$
$$\oplus (p_0 \oplus s_1 \oplus s_2 \oplus \ldots \oplus s_{k-1})$$

Since identical terms on the right hand side of equation 6 may be eliminated, we have $$i_{0_1} \oplus i_{0_2} \oplus \ldots \oplus i_{0_{l_0}} = [s_1 \oplus p_1] \oplus [s_2 \oplus p_2] \oplus \ldots \quad (6a)$$
$$\oplus [s_{k-1} \oplus p_{k-1}] \oplus (i_0 \oplus i_1 \oplus \ldots \oplus i_{m-1})$$

Next, substituting equation 3 into equation 6a, we have $$i_{0_1} \oplus i_{0_2} \oplus \ldots \oplus i_{0_{l_0}} = [p_1 \oplus i_{11} \oplus i_{12} \oplus \ldots \oplus i_{1l_1} \oplus p_1] \quad (6b)$$
$$\oplus [p_2 \oplus i_{21} \oplus i_{22} \oplus \ldots \oplus i_{2l_2} \oplus p_2]$$
$$\vdots$$
$$\oplus [p_{k-1} \oplus i_{k-1_1} \oplus i_{k-1_2} \oplus \ldots \oplus i_{k-1_{l_{k-1}}} \oplus p_{k-1}]$$
$$\oplus (i_0 \oplus i_1 \oplus \ldots \oplus i_{m-1})$$

Again eliminating identical terms on the right hand side of equation 6b, we have $$i_{0_1} \oplus i_{0_2} \oplus \ldots \oplus i_{0_{l_0}} = [i_{11} \oplus i_{12} \oplus \ldots \oplus i_{1l_1}] \quad (6c)$$
$$\oplus [i_{21} \oplus i_{22} \oplus \ldots \oplus i_{2l_2}]$$
$$\vdots$$
$$\oplus [i_{k-1_1} \oplus i_{k-1_2} \oplus \ldots \oplus i_{k-1_{l_{k-1}}}]$$
$$\oplus (i_0 \oplus i_1 \oplus \ldots \oplus i_{m-1})$$

Finally, substituting equation 6c into equation 4 we have $$OVP = p_0 \oplus s_1 \oplus s_2 \oplus \ldots \oplus s_{k-1} \quad (7)$$
$$\oplus [i_{11} \oplus i_{12} \oplus \ldots \oplus i_{1l_1}]$$
$$\oplus [i_{21} \oplus i_{22} \oplus \ldots \oplus i_{2l_2}]$$
$$\vdots$$
$$\oplus [i_{k-1_1} \oplus i_{k-1_2} \oplus \ldots \oplus i_{k-1_{l_{k-1}}}]$$
$$\oplus (i_0 \oplus i_1 \oplus \ldots \oplus i_{m-1})$$

Equation 7, with the duplicate terms eliminated, is the general form of the equation corresponding to the logical function to be implemented in PCHK$_0$ circuit 16. This general formulation for the logic of the PCHK$_0$ circuit 16 (which realizes OVP) is necessary to assure fault tolerance. As will be further explained in the example, infra, equation 7 must be modified in accordance with the specific Hamming code being used. Such modified equation will correspond to the logic to be implemented in the PCHK$_0$ circuit 16 for the particular Hamming code being used.

Figure 2:
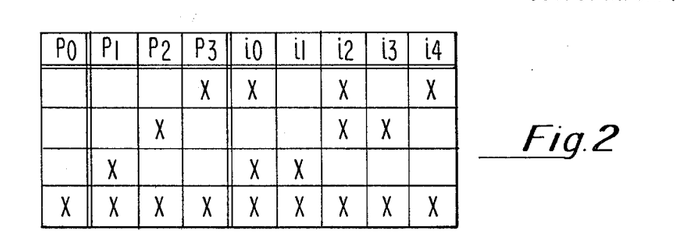
FIG. 2 is a diagram specifying a modified Hamming code and is used to illustrate a sample implementation of the present invention.

Referring now to FIG. 2, an example of how a sample Hamming code would be utilized with the present correction circuit will be presented. As previously discussed, the input parity bits $p_0, p_1, \ldots p_{k-1}$ are generated and may be stored at a location associated with the corresponding information bits $i_0, i_1, \ldots i_{m-1}$. For the Hamming code specified in FIG. 2 and starting with the general equation 1 for the non-leading parity bits, we have $$p_j = i_{j_0} \oplus i_{j_1} \oplus \ldots \oplus i_{j_{l_j}}, \quad 1 \leq j \leq k-1 \quad (1)$$

$$p_1 = i_{10} \oplus i_{11} = i_0 \oplus i_1, \text{ so for}$$

$p_1$ we have $1_0 = 0$, $1_1 = 1$ and $l_1 = 1$ $$p_2 = i_{20} \oplus i_{21} = i_2 \oplus i_3, \text{ so for}$$

$p_2$ we have $2_0 = 2$, $2_1 = 3$ and $l_2 = 1$ and $$p_3 = i_{30} \oplus i_{31} \oplus i_{32} = i_0 \oplus i_2 \oplus i_4, \text{ so for}$$

$p_3$ we have $3_0 = 0$, $3_1 = 2$, $3_2 = 4$ and $l_3 = 2$.

Next, using the general form of equation 2, we can calculate the leading parity bit $p_0$ as (6b)

$$p_0 = p_1 \oplus p_2 \oplus \ldots \oplus p_{k-1} \oplus i_0 \oplus i_1 \oplus \ldots \oplus i_{m-1} \quad (2)$$

Using the values calculated for the non-leading parity bits $p_1$, $p_2$ and $p_3$, we thus have $$p_0 = (i_0 \oplus i_1) \oplus (i_2 \oplus i_3) \oplus (i_0 \oplus i_2 \oplus i_4) \oplus (i_0 \oplus i_1 \oplus i_2 \oplus i_3 \oplus i_4)$$

Next, eliminating identical terms, we have $$p_0 = i_0 \oplus i_2$$

Thus, for the Hamming code specified in FIG. 2, we now know how to calculate all parity bits for the given set of five information bits. The parity and information bits are first utilized to calculate the logical functions which will generate the syndrome bits $s_1$, $s_2$, $s_3$, and OVP. Using general formula 3, we have $$s_j = p_j \oplus i_{j_1} \oplus i_{j_2} \oplus \ldots \oplus i_{j_l} \quad (3)$$

$$s_1 = p_1 \oplus i_{11} \oplus i_{12} = p_1 \oplus i_0 \oplus i_1$$

Thus the circuitry used in PCHK$_1$ 10 for this particular Hamming code is an exclusive OR of $p_1$, $i_0$ and $i_1$.

$$s_2 = p_2 \oplus i_{21} \oplus i_{22} = p_2 \oplus i_2 \oplus i_3$$

Thus the circuitry used in PCHK$_2$ 12 for this particular Hamming code is an exclusive OR of $p_2$, $i_2$ and $i_3$, and $$s_3 = p_3 \oplus i_{31} \oplus i_{32} \oplus i_{33} = p_3 \oplus i_0 \oplus i_2 \oplus i_4$$

Thus, the circuitry used in PCHK$_3$ for this particular Hamming code is an exclusive OR of $p_3$, $i_0$, $i_2$ and $i_4$. Using general formula 7, we can calculate OVP $$OVP = p_0 \oplus s_1 \oplus s_2 \oplus \ldots \oplus s_{k-1} \quad (7)$$
$$\oplus [i_{11} \oplus i_{12} \oplus \ldots \oplus i_{1l_1}]$$
$$\oplus [i_{21} \oplus i_{22} \oplus \ldots \oplus i_{2l_2}]$$
$$\vdots$$
$$\oplus [i_{k-1_1} \oplus i_{k-1_2} \oplus \ldots \oplus i_{k-1_{l_{k-1}}}]$$
$$\oplus (i_0 \oplus i_1 \oplus \ldots \oplus i_{m-1})$$

-continued $$OVP = p_0 \oplus s_1 \oplus s_2 \oplus s_3 \oplus [i_{11} \oplus i_{12}]$$
$$\oplus [i_{21} \oplus i_{22}] \oplus [i_{31} \oplus i_{32} \oplus i_{33}]$$
$$\oplus (i_0 \oplus i_1 \oplus i_2 \oplus i_3 \oplus i_4)$$

Next, eliminating identical terms, we have $$OVP = p_0 \oplus s_1 \oplus s_2 \oplus s_3 \oplus i_0 \oplus i_2$$

Thus, the circuitry used in $PCHK_0$ for this particular Hamming code is an exclusive OR of $p_0$, $s_1$, $s_2$, $s_3$, $i_0$ and $i_2$.

It should be noted that the latter derivations were merely presented as an aid to understanding the use of the present correction circuit and that the present correction circuit may be used with any Hamming code.

Referring again to FIG. 1, the operation of the present correction circuit in reporting and correcting errors will now be explained.

If there are no errors, the OVP signal produced at the output of the $PCHK_0$ circuit 16 will be 0 and syndrome bits $s_1, s_2, \ldots s_{k-1}$ will all be 0. In such case, the input information bits $i_0, i_1, \ldots, i_{m-1}$ are passed through unaltered to the output of exclusive OR circuit 18.

If there is one error, a unique subset of $\{OVP, s_1, s_2, \ldots, s_{k-1}\}$ will be one. This unique subset identifies the bit in error. In general, if only one syndrome bit is on, there has been a parity error. On the other hand, multiple syndrome bits being on corresponds to a non-parity bit error. The bit in error can then be complemented by decoding the syndrome bits into a correction vector (CVECTOR = $C_0, C_1, \ldots, C_{m-1}$) so that $$C_j = \begin{cases} 1 & \text{if } i_j \text{ is in error, } 0 \leq j \leq m-1 \\ 0 & \text{if } i_j \text{ is not in error} \end{cases} \quad (8)$$

and exclusive ORing CVECTOR with the input information bits $i_0, i_1, \ldots, i_{m-1}$ to form the correct output information bits $o_0, o_1, \ldots, o_{m-1}$ in accordance with the formula $$o_j = c_j \oplus i_j, \quad 0 \leq j \leq m-1. \quad (9)$$

The decoding of the syndrome bits $s_1, s_2, \ldots, s_{k-1}$ is performed by decoder 20. As will be obvious to those skilled in the art, the pattern of syndrome bits produced is decoded in accordance with the Hamming code used, the pattern of syndrome bits identifying the bit in error. Hence, the logical function performed by the decoder 20 will vary in accordance with the Hamming code used and the circuitry necessary to implement the decoder will be obvious to the user. Suffice it to say that the decoder 20 will produce at its output a CVECTOR containing elements $c_0, c_1, \ldots, c_{m-1}$ which identifies the bit in error in input information bits $i_0, i_1, \ldots, i_{m-1}$.

Referring now to exclusive OR circuit 18, in the preferred embodiment this circuit 18 includes m exclusive OR subcircuits, each of the exclusive OR subcircuits performing an exclusive OR of one of the CVECTOR elements $c_0, c_1, \ldots, c_{m-1}$ with one of the correspondingly positioned input information bits $i_0, i_1, \ldots, i_{m-1}$ to produce one of the output information bit $o_0, o_1, \ldots, o_{m-1}$, respectively. In the preferred embodiment, since the parity bits are not output, it is not necessary that OVP be decoded or that additional CVECTOR lines be provided for parity bits $p_1, p_2, \ldots, p_{k-1}$.

Since a single or double error in either the parity or information bits causes at least one of $OVP, s_1, s_2, \ldots, s_{k-1}$ to become one, the logical OR of these variables, as performed by OR circuit 22, detects the condition and outputs the detected condition as error line ERR from OR circuit 22. Thus, OR circuit 22 contains circuitry to perform the logical function $$ERR = OVP + s_1 + s_2 + \ldots + s_{k-1} \quad (10)$$

The circuitry necessary to implement the logical function of OR circuit 22 will be obvious to those skilled in the art.

As just mentioned, a single or double error causes the ERR signal to become one. The presence of a single or double error is distinguished by the fact that for a single error OVP will be one and for a double error OVP will be 0. To provide an error status indication for a double bit error, AND circuit 24 performs the logical function $$DE = ERR \cdot \overline{OVP} \quad (11)$$

Thus, if a double error occurred, the DE error status signal would be one.

Up to this point, the discussion of the error status indicators has only considered the situation where the parity check subcircuits $PCHK_0$ 16, $PCHK_1$ 10, $PCHK_2$ 12, ..., $PCHK_{k-1}$ 14 have been fault free.

The next situation to be considered is the occurrence of a single parity check subcircuit malfunction with correct input data patterns. Provided that the input data pattern is correct, the present correction circuit can tolerate faults in any of the parity check subcircuits $PCHK_0$ 16, $PCHK_1$ 10, $PCHK_2$ 12, ..., $PCHK_{k-1}$ 14.

Assuming that $PCHK_i$ ($1 \leq i \leq k-1$) malfunctions, then $s_i = 1$ and all other syndrome bits are 0. The decoder 20 interprets this condition the same way as for a fault free correction circuit when input parity bit $p_i$ is in error. Thus, the correct information bits are passed through uncomplemented to the output of exclusive OR 18. Since OVP is a function of the syndrome bits, OVP will equal one. As a result, DE = 0, and ERR = 1 so that the fault is reported as a single bit error, thus insuring the continued operation of a system utilizing the present correction circuit.

Assuming that $PCHK_0$ 16 malfunctions, then OVP will be one. In such case, all syndrome bits will be 0, so that the correct information bits are not complemented. The error status lines will be ERR = 1 and DE = 0, so that the fault is reported as a single bit error.

Next, the case of a single parity check subcircuit malfunction in the presence of a single bit error will be considered.

Assuming that an information bit is in error, in a fault free correction circuit at least two syndrome bits will be one, OVP and ERR will both be one, and DE will be 0. Since at least one syndrome bit must remain one after a single parity check subcircuit failure, ERR will be one. That is, if there is a failure in a parity check subcircuit and a single bit error, then either three syndrome bits must be on (if the failed parity check subcircuit is not one of the two parity check subcircuits whose produced syndrome bits would have been one anyway) or one syndrome bit must be on (if the failed parity check subcircuit is one of those parity check subcircuits whose output produced syndrome bit would have been one if not for the failure). If PCHK$_0$ 16 fails, OVP will be 0. If a different parity check subcircuit PCHK$_i$, $1 \leq i \leq k-1$, fails, exactly one syndrome bit will be complemented. In such case, OVP would equal 0 and DE would equal one. Thus an information bit error in the presence of a parity check subcircuit malfunction will always be reported as a double error.

Assuming that input parity bit p$_0$ is in error, in a fault free circuit OVP will be one, all syndrome bits s$_1$, s$_2$, ..., s$_{k-1}$ will be 0, ERR will equal one and DE will be 0. If a parity check subcircuit other than PCHK$_0$ 16 fails, some syndrome bit s$_i$ will become one. Thus OVP will be complemented so that OVP will be 0 and ERR will remain one. Thus DE will be one and a double error will be reported. On the other hand, if PCHK$_0$ 16 fails, then OVP, ERR and DE will all be 0 which indicates no error. However, in this case the correct information bits are output so that no net error occurred.

Assuming that some other input parity bit p$_i$, $1 \leq i \leq k-1$, is in error, in a fault free circuit OVP will be one, s$_i$ will be one, ERR will be one, DE will be 0, and all other syndrome bits will remain 0. If a parity check subcircuit other than PCHK$_1$ fails, ERR will be one since s$_i$ will remain one. However, OVP will be 0 since either PCHK$_0$ 16 failed or a PCHK$_j$ failure, where $j \neq i$, complemented exactly one syndrome bit. Thus a double error will be indicated (DE=1, ERR=1). If PCHK$_i$ failed, OVP, all syndrome bits, ERR and DE will all be zero and no failure will be indicated. However, in this case the correct information bits are output and no net error occurred.

In summary then, if there is a single bit error in the presence of a parity check subcircuit failure either a double bit error will be indicated or the output information bits will be correct with no error indicated.

Having shown and described the generalized version of the preferred embodiment of the present invention, those skilled in the art will realize that various omissions, substitutions and changes in forms and details of the present invention may be made without departing from the spirit of the invention. Thus, it will be obvious to those skilled in the art that the generalized embodiment disclosed must be particularized to accommodate the particular Hamming code being utilized. It is the invention, therefore, to be limited only as indicated by the scope of the following claims.

What is claimed is:

1. A fault tolerant circuit for correcting and detecting errors in an inputted data pattern, said inputted data pattern encoded in a modified Hamming type code, said inputted data pattern including a set of m input information bits, i$_0$, i$_1$, ..., i$_{m-1}$, and a set of k parity bits, p$_0$, p$_1$, ..., p$_{k-1}$, where $m \geq k > 0$, said circuit capable of tolerating a failure of any one of a plurality of elements included in said circuit without corrupting the information bits of a correct inputted data pattern, said circuit comprising:
k−1 parity check means, each of said k−1 parity check means receiving a different one of k−1 subsets of the set of m input information bits and one of a first subset of the set of k parity bits, each of said k−1 parity check means for producing a syndrome bit corresponding to its received parity bit;
decoder means, receiving said produced syndrome bits, for decoding said produced syndrome bits into a correction vector;
exclusive ORing means, receiving said correction vector and said set of m input information bits, for producing a set of m output information bits; and
error status means, responsive to a second subset of said set of k parity bits, a second subset of the set of m information bits and said produced syndrome bits, for providing error status indications including an indication that the set of m output information bits is correct in response to said circuit receiving said correct inputted data pattern and the occurrence of said failure of any one of said plurality of elements.

2. The circuit in accordance with claim 1 wherein said plurality of elements includes said k-1 parity check means.

3. The correction circuit in accordance with claim 1 wherein said error status means includes:
overall parity means, receiving said second subset of the set of k parity bits, said second subset of the set of m input information bits and said produced syndrome bits, said overall parity means for generating an overall parity indication; and
status indication means, receiving said produced syndrome bits and said overall parity indication, said status indication means for producing said error status indications.

4. The correction circuit in accordance with claim 3 wherein said first subset of the set of k parity bits includes the non-leading parity bits p$_j$, where $1 \leq j \leq k-1$.

5. The correction circuit in accordance with claim 3 wherein:
said first subset of the set of k parity bits includes the non-leading parity bits p$_j$, where $1 \leq j \leq k-1$; and
said second subset of the set of k parity bits includes the leading parity bit P$_0$.

6. The correction circuit in accordance with claim 3 wherein said status indication means includes:
a logical OR gate receiving as its inputs each of said produced syndrome bits and said overall parity indication; and
a logical AND gate receiving as its inputs the output of said logical OR gate and a signal corresponding to the inverse of the overall parity indication.

7. The correction circuit in accordance with claim 1 wherein each of said k−1 parity check means includes means for performing a logical exclusive OR of the parity bit p$_j$ and each of the input information bits i$_{j1}$, i$_{j2}$, ..., i$_{jl_j}$, where p$_j$ is the parity bit received by the respective parity check means and i$_{j1}$, i$_{j2}$, ..., i$_{jl_j}$ is the subset of the set of m input information bits specified by said modified Hamming code as included in the generation of said parity bit p$_j$, whereby a syndrome bit s$_j$ is produced at the output of said respective parity check means.

8. The correction circuit in accordance with claim 3 wherein each of said k−1 parity check means includes means for performing a logical exclusive OR of the parity bit p$_j$ and each of the information bits i$_{j1}$, i$_{j2}$, ..., i$_{jl_j}$, where p$_j$ is the parity bit received by the respective parity check means and i$_{j1}$, i$_{j2}$, ..., i$_{jl}$ is the subset of the set of m input information bits specified by said modified Hamming code as included in the generation of said parity bit p$_j$, whereby a syndrome bit s$_j$ is produced at the output of said respective parity check means.

9. The correction circuit in accordance with claim 3 wherein said overall parity means includes means for performing a logical exclusive OR of each member of the second subset of the set of k parity bits, the produced syndrome bits and the second subset of the set of m input information bits, whereby said overall parity indication is produced at the output of said overall parity means.

10. The correction circuit in accordance with claim 8 or 9 wherein:
said first subset of the set of k parity bits includes the non-leading parity bits $p_j$, where $1 \leq j \leq k-1$; and
said second subset of the set of k parity bits includes the leading parity bit $p_0$.

11. The correction circuit in accordance with claim 8 wherein said overall parity means includes means for performing a logical exclusive OR of each member of the second subset of the set of k parity bits, the produced syndrome bits and the second subset of the set of m input information bits, whereby said overall parity indication is produced at the output of said overall parity means.

12. The correction circuit in accordance with claim 3 or 9 wherein:
said second subset of the set of k parity bits includes the leading parity bit $p_0$; and
said second subset of the set of m input information bits includes each of the k−1 subsets of the set of m input information bits and further includes the set of m input information bits.

13. The correction circuit in accordance with claim 10 wherein:
said second subset of the set of m input information bits includes each of the k−1 subsets of the set of m input information bits and further includes the set of m input information bits.

14. The correction circuit in accordance with claim 3 wherein:
said decoder means includes means to decode said produced syndrome bits in accordance with said modified Hamming code; and
said correction vector is a sequence of binary digits $C_0, C_1, \ldots, C_{m-1}$ corresponding to the sequence of m input information bits $i_0, i_1, \ldots, i_{m-1}$, said sequence of binary digits identifying which corresponding input information bit should be complemented.

15. The correction circuit in accordance with claim 14 wherein said exclusive ORing means includes means for performing a logical exclusive OR of each digit in said correction vector with a corresponding input information bit to produce at the output of said exclusive ORing means said set of m output information bits.

16. A fault tolerant circuit for correcting and detecting errors in an inputted data pattern, said inputted data pattern encoded in a modified Hamming type code, said inputted data pattern including a set of input information bits and a set of parity bits, said circuit capable of tolerating a failure of any one of a plurality of elements included in said circuit without corrupting the information bits of a correct inputted data pattern, said circuit comprising:
parity check means, responsive to said inputted data pattern, for generating a set of syndrome bits;
decoder means, responsive to said set of syndrome bits, for decoding said set of syndrome bits into a correction vector;
forming means, responsive to said correction vector and said set of input information bits, for producing a set of output information bits;
overall parity means, responsive to said inputted data pattern and said set of syndrome bits, for generating an overall parity indication; and
status indication means, responsive to said set of syndrome bits and said overall parity indication, for producing error status indications including an indication that the set of output information bits is correct in response to said circuit receiving said correct inputted data pattern and the occurrence of said failure in any one of said plurality of elements.

17. The fault tolerant circuit in accordance with claim 16 wherein said parity check means includes a plurality of parity check circuits, each of said parity check circuits receiving a different subset of said set of input information bits and one of said set of parity bits, each of said parity check circuits for generating one of said set of syndrome bits.

18. The fault tolerant circuit in accordance with claim 16 wherein said overall parity means includes means for performing a logical exclusive OR of each member of a subset of the set of parity bits, the set of syndrome bits and a second subset of the set of information bits, whereby said overall parity indication is produced at the output of said overall parity means.

19. The fault tolerant correction circuit in accordance with claim 18 wherein said status indication means includes:
a logical OR gate receiving as its inputs said set of syndrome bits and said overall parity indication; and
a logical AND gate receiving as its inputs the output of said logical OR gate and a signal corresponding to the inverse of said overall parity indication.

20. The circuit in accordance with claim 16 wherein said plurality of elements includes said parity check means and said overall parity means.

21. A fault tolerant circuit for correcting and detecting errors in an inputted data pattern, said inputted data pattern encoded in a modified Hamming type code, said inputted data pattern including a set of input information bits and a set of parity bits, said circuit capable of tolerating a failure of any one of a plurality of elements included in said circuit without corrupting the information bits of a correct inputted data pattern, said circuit comprising:
parity check means, responsive to said set of input information bits and said set of parity bits, for producing a set of syndrome bits;
decoder means, responsive to said set of syndrome bits, for decoding said set of syndrome bits into a correction vector;
exclusive ORing means, responsive to said correction vector and said set of input information bits, for producing a set of output information bits; and
error status means, responsive to said inputted data pattern and said set of syndrome bits, said error status means including means for indicating that the set of output information bits is correct in response to said circuit receiving said correct inputted data pattern and the occurrence of said failure in any one of said plurality of elements.

22. The circuit in accordance with claim 21 wherein said error status means includes:
overall parity means, responsive to said inputted data pattern and said set of syndrome bits, said overall parity means for generating an overall parity indication; and status indication means, responsive to said set of syndrome bits and said overall parity indication, said status means for providing error status indications.

23. The circuit in accordance with claim 22 wherein said status indication means includes:
a logical OR gate receiving as its inputs said set of syndrome bits and said overall parity indication; and
a logical AND gate receiving as its inputs the output of said logical OR gate and a signal corresponding to the inverse of said overall parity indication.

24. The circuit in accordance with claim 22 wherein said overall parity means includes means for performing a logical exclusive OR of each member of a subset of the set of parity bits, the set of syndrome bits and a subset of the set of information bits, whereby said overall parity indication is produced.

25. The circuit in accordance with claim 21 wherein said plurality of elements includes said parity check means.

26. A fault tolerant circuit for correcting and detecting errors in an inputted data pattern, said inputted data pattern encoded in a modified Hamming type code, said inputted data pattern including a set of m input information bits, $i_0, i_1, \ldots, i_{m-1}$ and a set of k parity bits $p_0 p_1 \ldots, p_{k-1}$, where $m \geq k > 0$, said circuit comprising:
$k-1$ parity check means, each of said $k-1$ parity check means receiving a different one of $k-1$ subsets of the set of m input information bits and one of a first subset of the set of k parity bits, each of said $k-1$ parity check means for producing a syndrome bit corresponding to its received parity bit;
decoder means, receiving said produced syndrome bits, for decoding said produced syndrome bits into a correction vector;
exclusive ORing means, receiving said correction vector and said set of m input information bits, for producing a set of m output information bits; and
error status means for providing error status indications, said error status means including
overall parity means, receiving a second subset of the set of k parity bits, a second subset of the set of m input information bits and said produced syndrome bits, said second subset of the set of k parity bits including the leading parity bit $p_0$, said second subset of the set of m input information bits including each of the $k-1$ subsets of the set of m input information bits and the set of m input information bits, said overall parity means for generating an overall parity indication, and
status indication means, receiving said produced syndrome bits and said overall parity indication, for producing said error status indications.

27. A fault tolerant circuit for correcting and detecting errors in an inputted data pattern, said inputted data pattern encoded in a modified Hamming type code, said inputted data pattern including a set of input information bits and a set of parity bits, said circuit comprising:
parity check means, responsive to said inputted data pattern, for generating a set of syndrome bits;
decoder means, responsive to said set of syndrome bits, for decoding said set of syndrome bits into a correction vector;
forming means, responsive to said correction vector and said set of input information bits, for producing a set of output information bits;
overall parity means for generating an overall parity indication, said overall parity means including means for performing a logical exclusive OR of each member of a subset of the set of parity bits, the set of syndrome bits and a second subset of the set of input information bits; and
status indication means, responsive to said set of syndrome bits and said overall parity indication, for producing error status indications.

28. A fault tolerant circuit for correcting and detecting errors in an inputted data pattern, said inputted data pattern encoded in a modified Hamming type code, said inputted data pattern including a set of input information bits and a set of parity bits, said circuit comprising:
parity check means, responsive to said set of input information bits and said set of parity bits, for producing a set of syndrome bits;
decoder means, responsive to said set of syndrome bits, for decoding said set of syndrome bits into a correction vector;
exclusive ORing means, responsive to said correction vector and said set of input information bits, for producing a set of output information bits;
overall parity means, responsive to said inputted data pattern and said set of syndrome bits, for generating an overall parity indication; and
status indication means for providing error status indications, said status indication means including a logical OR gate receiving as its inputs said set of syndrome bits and said overall parity indication, and a logical AND gate receiving as its inputs the output of said logical OR gate and a signal corresponding to the inverse of said overall parity indication.

* * * * *

UNITED STATES PATENT AND TRADEMARK OFFICE
CERTIFICATE OF CORRECTION

PATENT NO. : 4,417,339    Page 1 of 2
DATED : November 22, 1983
INVENTOR(S) : Robert G. Cantarella It is certified that error appears in the above-identified patent and that said Letters Patent is hereby corrected as shown below:

In column 3, delete line 40 and substitute:
$$p_j = i_{j_0} \oplus i_{j_1} \oplus \cdots \oplus i_{j_{1_j}}, \quad 1 \leq j \leq k-1 \qquad (1)$$

In column 3, line 46, change "$i_{j_0}$" to --$i_{j_0}$--.

In column 4, delete line 25 and substitute:
$$s_j = p_j \oplus i_{j_1} \oplus i_{j_2} \oplus \cdots \oplus i_{j_{1_j}} \qquad (3)$$

In column 5, delete line 10 and substitute:
$$i_{0_1} \oplus i_{0_2} \oplus \cdots \oplus i_{0_{1_0}} = [s_1 \oplus p_1] \oplus [s_2 \oplus p_2] \oplus \cdots \qquad (6a)$$

In column 5, delete line 41 and substitute:
$$\oplus \, [i_{2_1} \oplus i_{2_2} \oplus \cdots \oplus i_{2_{1_2}}]$$

In column 5, delete line 68 and substitute:
$$p_j = i_{j_0} \oplus i_{j_1} \oplus \cdots \oplus i_{j_{1_j}}, \quad 1 \leq j \leq k-1 \qquad (1)$$

In column 6, delete lines 43-45 and substitute:
$$s_j = p_j \oplus i_{j_1} \oplus i_{j_2} \oplus \cdots \oplus i_{j_{1_j}} \qquad (3)$$

$$s_1 = p_1 \oplus i_{1_1} \oplus i_{1_2} = p_1 \oplus i_0 \oplus i_1$$

In claim 5, at column 10, line 35, change "$P_0$" to --$P_0$--.

UNITED STATES PATENT AND TRADEMARK OFFICE
CERTIFICATE OF CORRECTION

PATENT NO. : 4,417,339

DATED : November 22, 1983

INVENTOR(S) : Robert G. Cantarella

Page 2 of 2

It is certified that error appears in the above-identified patent and that said Letters Patent is hereby corrected as shown below:

In claim 8, at column 10, line 60, change "$i_{j1}$" to $--i_{j_{1_j}}--$.

Signed and Sealed this

Seventh Day of February 1984

[SEAL]

Attest:

Attesting Officer

GERALD J. MOSSINGHOFF

Commissioner of Patents and Trademarks